(12) United States Patent
Takamoto et al.

(10) Patent No.: US 6,300,558 B1
(45) Date of Patent: Oct. 9, 2001

(54) LATTICE MATCHED SOLAR CELL AND METHOD FOR MANUFACTURING THE SAME

(75) Inventors: Tatsuya Takamoto; Hiroshi Kurita; Takaaki Agui; Eiji Ikeda, all of Saitama-ken (JP)

(73) Assignee: Japan Energy Corporation, Tokyo (JP)

( * ) Notice: Subject to any disclaimer, the term of this patent is extended or adjusted under 35 U.S.C. 154(b) by 0 days.

(21) Appl. No.: 09/553,495

(22) Filed: Apr. 20, 2000

(30) Foreign Application Priority Data

Apr. 27, 1999 (JP) .................................. 11-120568

(51) Int. Cl.[7] .......................... H01L 31/068; H01L 31/04
(52) U.S. Cl. .......................... 136/262; 136/249; 136/255; 136/261; 257/461; 257/463; 257/464; 438/73; 438/93; 438/94
(58) Field of Search ...................... 136/249 TJ, 249 MJ, 136/255, 261, 262; 257/461, 463, 464; 438/74, 93, 94

(56) References Cited

U.S. PATENT DOCUMENTS

| | | | |
|---|---|---|---|
| 4,017,332 | * | 4/1977 | James .................................. 136/262 |
| 4,332,974 | * | 6/1982 | Fraas .................................. 136/249 |
| 4,400,221 | * | 8/1983 | Rahilly ................................ 136/262 |
| 4,915,744 | * | 4/1990 | Ho et al. ............................. 136/262 |
| 5,376,185 | * | 12/1994 | Wanlass .............................. 136/262 |

FOREIGN PATENT DOCUMENTS 58-127386 * 7/1983 (JP) .

OTHER PUBLICATIONS

Werthen et al, Conference Record, 20th IEEE Photovoltaic Specialists Conference, Las Vegas, NV, pp. 640–643, Sep. 1988.*

* cited by examiner

Primary Examiner—Alan Diamond
(74) Attorney, Agent, or Firm—McDonnell Boehnen Hulbert & Berghoff

(57) ABSTRACT

A solar cell comprises at least a germanium (Ge) substrate, buffer layers formed on the germanium substrate, a first $In_xGa_{1-x}As$ layer of first conductivity type formed on the buffer layers, and a second $In_xGa_{1-x}As$ layer of second conductivity type formed on the first $In_xGa_{1-x}As$ layer to form pn junction. Because the composition x of In contained in the first $In_xGa_{1-x}As$ layer and the second $In_xGa_{1-x}As$ layer is in a range of $0.005 \leq x \leq 0.015$, the inexpensive and high conversion efficiency solar cell can be achieved.

26 Claims, 10 Drawing Sheets x=0

$\begin{pmatrix} \text{COMPARATIVE} \\ \text{EXAMPLE} \end{pmatrix}$ x=0.007 x=0.01 x=0.014 x=0.02

|  | COMPARATIVE EXAMPLE | PRESENT INVENTION |
|---|---|---|
| OPEN CIRCUIT VOLTAGE  Voc(V) | 0.983 | 0.997 |
| SHORT CIRCUIT CURRENT DENSITY  Jsc(mA/cm$^2$) | 22.12 | 23.01 |
| FILL FACTOR  FF(%) | 80.9 | 83.3 |
| EFFICIENCY  $\eta$ (%) | 17.58 | 19.10 |

Fig. 5B

|  | COMPARATIVE EXAMPLE | PRESENT INVENTION |
|---|---|---|
| BOTTOM CELL | GaAs | $In_{0.01}Ga_{0.99}P$ |
| TOP CELL | $In_{0.48}Ga_{0.52}P$ | $In_{0.49}Ga_{0.51}P$ |
| OPEN CIRCUIT VOLTAGE Voc(V) | 2.357 | 2.389 |
| SHORT CIRCUIT CURRENT DENSITY Jsc(mA/cm$^2$) | 13.73 | 15.20 |
| FILL FACTOR FF(%) | 84.4 | 85.1 |
| EFFICIENCY η (%) | 27.31 | 30.90 |

*Fig. 7*

LATTICE MATCHED SOLAR CELL AND METHOD FOR MANUFACTURING THE SAME

BACKGROUND OF THE INVENTION

1. Field of the Invention

The present invention relates to a high efficiency solar cell that can be used as an energy source of an artificial satellite, etc. and, more particularly, a lattice matched solar cell using group III-V compound semiconductor, epitaxially grown on a germanium (Ge) substrate, and a method for manufacturing the same.

2. Description of the Related Art

Since the human beings are confronted by the serious energy problem, and in connection with the issue of global warming, the solar cell attracts a good deal of public attention, because the solar cell is supposed to be a clean energy source and to be environmental friendly, contrary to the fossil fuel, which emits carbon dioxide ($CO_2$). However, it greatly depends upon its cost performance whether or not the solar cell can be put to practical and commercial use. That is, how to reduce the production cost is an extremely important factor in the solar cell.

The solar cell which employs the group III-V compound semiconductor such as gallium arsenide (GaAs) has a feature of the high efficiency, but contains the problem that cost of the group III-V compound semiconductor substrate is extremely high. For example, the GaAs substrate is a very expensive semiconductor substrate such that, although depending on the size and the grade, it exceeds hundred of dollars to a thousand dollar per wafer. For this reason, the spotlight of attention has been focused on the group III-V compound semiconductor solar cell in which the group III-V compound semiconductor is heteroepitaxially grown on the germanium (Ge) substrate, because Ge is relatively inexpensive and the heteroepitaxially grown structure has strong mechanical strength. Therefore, the GaAs/Ge heteroepitaxially solar cell has been known as the group III-V compound semiconductor solar cell epitaxially grown on the Ge substrate.

In addition, the tandem solar cell has also been known in which the indium gallium phosphide (InGaP) solar cell which is supposed to be lattice-matched with GaAs and has the wider band gap Eg than GaAs is further stacked on the GaAs/Ge heteroepitaxial solar cell. Each of the GaAs/Ge heteroepitaxial solar cell and the GaAs/Ge-GaAs/InGaP tandem solar cell is heteroepitaxially grown by the method such as the metalorganic chemical vapor deposition (MOCVD) method. In such heteroepitaxy, formation of the phase separation layer such as the antiphase domain due to the lattice mismatching between the surface lattice of the Ge substrate as the element semiconductor and the surface lattice consisting of gallium (Ga) and arsenic (As) atoms, etc. poses the problem. In order to avoid such formation of the phase separation layer, upon growing the GaAs layer on a surface of the Ge substrate, first the low temperature buffer layer having a small thickness of about 0.1 $\mu$m is grown at the low temperature of less than 600° C., and then a relatively thick (2 to 3 $\mu$m) GaAs buffer layer is grown by increasing the substrate temperature up to the normal growth temperature (about 700° C.). Then, after the low temperature buffer layer and the relatively thick GaAs buffer layer have been formed, a predetermined stacked structure needed to constitute the desired GaAs based solar cell or a stacked structure constituting the GaAs/InGaP tandem solar cell is grown.

In this case, it has been expected that the dislocation or the defect occurred on the Ge/GaAs heterojunction interface would be reduced by the above thin low temperature buffer layer and the relatively thick GaAs buffer layer. However, the good Ge/GaAs heteroepitaxy has not been obtained in practice. That is, it has been difficult to remove:

(i) the misfit dislocation caused due to the difference in the lattice constants between GaAs and Ge crystals, and (ii) the dislocation caused due to the difference in thermal expansion coefficients between GaAs and Ge crystals in cooling process from the growth temperature.

In the prior art, the strained-layer superlattice, etc. are employed as the buffer layer and thus the slight effect of reducing the dislocation has been achieved, nevertheless they have not brought about the great improvement. It is guessed that the misfit dislocation in the above (i) is caused to relax the internal distortion, when the thickness of the GaAs layer, having the lattice mismatching rate of about 0.08% to the Ge substrate, exceeds about 0.3 to 0.5 $\mu$m. Therefore, it is difficult for the GaAs solar cell layer, that needs its thickness of more than 2 to 3 $\mu$m to absorb effectively the solar light, to prevent the generation of the misfit dislocation. In addition, since the dislocation of the grown layer caused in cooling process from the growth temperature to the room temperature, etc. stated in the above (ii) are due to difference between the thermal expansion coefficients (Ge: $5.5 \times 10^{-6}$ $K^{-1}$, GaAs: $6.0 \times 10^{-6}$ $K^{-1}$), it is difficult to prevent perfectly the generation of such dislocation, etc.

SUMMARY OF THE INVENTION

The present invention has been made to remove the above drawback and it is an object of the present invention to provide a solar cell that has high conversion efficiency and is formed by the heteroepitaxy on a Ge substrate, which is inexpensive and has a strong mechanical strength.

It is another object of the present invention to provide a solar cell configured such that the lattice mismatching rate between the Ge substrate and $In_xGa_{1-x}As$ layer can be suppressed within the range of −0.05% to +0.05%, the lattice mismatching rate can be reduced to a very small value which can be regarded substantially as zero.

It is still another object of the present invention to provide a solar cell configured such that generation of the misfit dislocation peculiar to the heterojunction between the Ge substrate and $In_xGa_{1-x}As$ layer can be prevented.

It is still another object of the present invention to provide a solar cell configured such that the thermal expansion coefficient of $In_xGa_{1-x}As$ layer can become close to the Ge substrate so the generation of the dislocation and the defect which cause the reduction in the conversion efficiency of the solar cell can be prevented.

It is still another object of the present invention to provide a solar cell configured such that the antiphase domain due to the lattice mismatching between the surface lattice of the Ge substrate and the surface lattice of III-V compound semiconductor can be avoided.

It is still another object of the present invention to provide a solar cell configured such that flatness of the interface at the atomic level and the matching between the lattice constant of the $In_xGa_{1-x}As$ layer and the lattice constant of the Ge substrate can be achieved so that the misfit dislocation and the defect are never generated, even if the thickness of the $In_xGa_{1-x}As$ buffer layer is set to more than 2 to 3 $\mu$m.

It is still another object of the present invention to provide a solar cell configured such that $In_xGa_{1-x}As$ layers having high perfection of the crystallographical quality and good surface morphology can be obtained so that the high open circuit voltage Voc, and the high conversion efficiency η are achieved.

It is still another object of the present invention to provide a lattice matched multi-junction solar cell, which is inexpensive and has a strong mechanical strength and high conversion efficiency.

It is still another object of the present invention to provide a solar cell manufacturing method which is capable of avoiding generation of crystal defect on an interface between a heteroepitaxy layer and a substrate and a high resistivity layer in vicinity of the interface, at the time of epitaxial growth using the Ge substrate.

In order to achieve the above objects, a first feature of the present invention lies in a structure of a solar cell, the solar cell has at least a germanium (Ge) substrate, a buffer layer formed on the germanium substrate, a first $In_xGa_{1-x}As$ layer of first conductivity type formed on the buffer layer, and a second $In_xGa_{1-x}As$ layer of second conductivity type formed on the first $In_xGa_{1-x}As$ layer to form a first pn junction, wherein the compositions x of indium (In) in the first $In_xGa_{1-x}As$ layer and the second $In_xGa_{1-x}As$ layer are in a range of $0.005 \leq x \leq 0.015$. Where the "first conductivity type" and the "second conductivity type" are mutually opposite conductivity types, and thus one is the n-type and the other is the p-type. Preferably the composition x of In should be set a value in the range of $0.007 \leq x \leq 0.014$, and $x=0.01$ is most preferable.

In the first feature of the present invention, even if at least one of the first and second $In_xGa_{1-x}As$ layers is formed to have a thickness of 2 to 3 μm or more in order to convert effectively the solar light to electrical energy, the lattice mismatching rate can be suppressed within the range of −0.05% to +0.05% by adding the composition x of In into the first and second $In_xGa_{1-x}As$ layers at a rate of 0.005 to 0.015. If the composition x of In is set to $x=0.01$, the lattice mismatching rate can be reduced to a very small value which can be regarded substantially as zero. In this manner, since the lattice constants of the first and second $In_xGa_{1-x}As$ layers are set very close to the lattice constant of the Ge substrate so as to match with each other, generation of the misfit dislocation peculiar to the heterojunction can be prevented. Also, there is such effectiveness that the thermal expansion coefficient can become close to the Ge substrate by adding In into the GaAs layer. Therefore, according to the first feature of the present invention, generation of the dislocation and the defect which cause the reduction in the conversion efficiency of the solar cell can be prevented and also the high conversion efficiency solar cell can be fabricated on the Ge substrate which is inexpensive and has the strong mechanical strength.

In the first feature of the present invention, preferably the buffer layer comprises a GaAs layer, and an $In_xGa_{1-x}As$ layer formed on the GaAs layer to have composition x of In in a range of $0.005 \leq x \leq 0.015$. The creation of the phase separation layer such as the antiphase domain due to the lattice mismatching between the surface lattice of the Ge substrate, formed of the single element Ge, and the surface lattice consisting of Ga and As atoms can be avoided, by growing the GaAs buffer layer at the relatively low temperature to have a thickness of about 0.1 μm. Also, flatness of the interface at the atomic level and the matching between the lattice constant of the $In_xGa_{1-x}As$ layer and the lattice constant of the Ge substrate can be achieved, by providing the buffer layer which is formed of the $In_xGa_{1-x}As$ layer whose composition x of In is set to a value in the range of $0.005 \leq x \leq 0.015$. Since the lattice mismatching rate of the $In_xGa_{1-x}As$ buffer layer can be suppressed in the range of −0.05% to +0.05%, the misfit dislocation and the defect are never generated even if the thickness of the $In_xGa_{1-x}As$ buffer layer is set to more than 2 to 3 μm. Therefore, the good first and second $In_xGa_{1-x}As$ layers with the high perfection of the crystallographical quality can be grown on the $In_xGa_{1-x}As$ buffer layer, and thus the good surface morphology, the high open circuit voltage Voc, and the high conversion efficiency (power generating efficiency) η can be achieved.

In addition, in the first feature of the present invention, the above first pn junction may be used as a bottom cell, and a top cell consisting of second pn junction that is formed of semiconductor whose band gap Eg is wider than the first and second $In_xGa_{1-x}As$ layers may be formed on the bottom cell. According to such multi-junction solar cell, since the top cell and the bottom cell can share the wavelengths, it is possible to provide the inexpensive solar cell which can increase the high conversion efficiency (power generating efficiency) η in excess of 30%.

Furthermore, in the first feature of the present invention, the multi-junction solar cell can be constructed in which a germanium layer whose conductivity is opposite to the germanium substrate is formed on the germanium substrate to form third pn junction, and the third pn junction is used as a substrate side cell. For example, the substrate side cell may be constructed by epitaxially growing the second conductivity type Ge layer on the first conductivity type Ge substrate to form the pn junction. Otherwise, the substrate side cell may be constructed by diffusing the second conductivity type dopant (impurity atoms of second conductivity type) into the first conductivity type Ge substrate to form the third pn junction. As the n-type dopant, arsenic (As), antimony (Sb), phosphorus (P), etc. may be employed. In contrast, the substrate side cell may be constructed by epitaxially growing the p-type Ge layer on the n-type Ge substrate or diffusing the p-type dopant into the n-type Ge substrate to form the pn junction. As the p-type dopant, gallium (Ga), etc. may be employed. The higher conversion efficiency η can be achieved by sharing the wavelengths with the substrate side cell, the top cell, and the bottom cell. Because the band gaps Eg of the first and second $In_xGa_{1-x}As$ layers are smaller than GaAs, it is ready to select the constituent material in the multi-junction solar cell such that the band gap Eg becomes wider sequentially in the order of the substrate side cell, the bottom cell, and the top cell. In this way, the margin in selecting the constituent material can be increased and also the wavelength spectrum band to contribute the substantial power generation can be increased.

A second feature of the present invention inheres in a method for manufacturing a solar cell, the method includes at least the steps of (a) epitaxially growing a buffer layer on a germanium substrate, (b) epitaxially growing a first $In_xGa_{1-x}As$ layer of first conductivity type on the buffer layer, and (c) epitaxially growing a second $In_xGa_{1-x}As$ layer of second conductivity type on the $In_xGa_{1-x}As$ buffer layer. The composition x of the first $In_xGa_{1-x}As$ layer lies in a range of $0.005 \leq x \leq 0.015$. The composition x of the $In_xGa_{1-x}As$ buffer layer and the second $In_xGa_{1-x}As$ layer may also lie in a range of $0.005 \leq x \leq 0.015$. In the epitaxial growth according to the second feature of the present invention, the MOCVD method, the chemical beam epitaxy (CBE) method, the molecular beam epitaxy (MBE) method, the atomic layer epitaxy (ALE) method, the molecular layer epitaxy (MLE) method, or the like can be employed. For example, in the case of the MOCVD method, if the GaAs buffer layer is formed at the relatively low temperature of about 500 to 650° C., preferably at about 600° C., formation of the phase separation layer such as the antiphase domain between the Ge substrate and the GaAs buffer layer, etc. can be avoided. In addition, the epitaxial growth of the $In_xGa_{1-x}As$ buffer layer and the first and second $In_xGa_{1-x}As$ layers may be conducted at the temperature that is higher than the substrate temperature of the GaAs buffer layer (low temperature buffer layer), e.g., of 650 to 750° C., preferably of 650 to 700° C.

In the second feature of the present invention, the lattice mismatching rate can be suppressed within the range of −0.05% to +0.05% by setting the composition x of In to the value in the range of $0.005 \leq x \leq 0.015$. In this manner, since the lattice constants of the first and second $In_xGa_{1-x}As$ layers are set very close to the lattice constant of the Ge substrate to match with each other, generation of the misfit dislocation peculiar to the heterojunction can be prevented. Also, there is such an effectiveness that the thermal expansion coefficient can become close to the Ge substrate by adding In into the GaAs layer. Therefore, according to the solar cell manufacturing method according to the second feature of the present invention, generation of the misfit dislocation and the defect on the heterojunction interface and also the inexpensive solar cell that has the high conversion efficiency and has the strong mechanical strength can be fabricated. In other word, the solar cell manufacturing method which is able to avoid the generation of the high resistivity layer on the interface between the heteroexpitaxially grown layer and the substrate can be provided.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF DRAWINGS

FIG. 5B is a table showing characteristics of the GaAs solar cell according to the comparative example and the $In_{0.01}Ga_{0.99}As$ solar cell according to the first embodiment for the purpose of comparison;

FIG. 7 is a table showing characteristics of a multi-junction solar cell according to the comparative example and the multi-junction solar cell according to the second embodiment for the purpose of comparison.

DETAILED DESCRIPTION OF THE PREFERRED EMBODIMENTS

Figure 1:
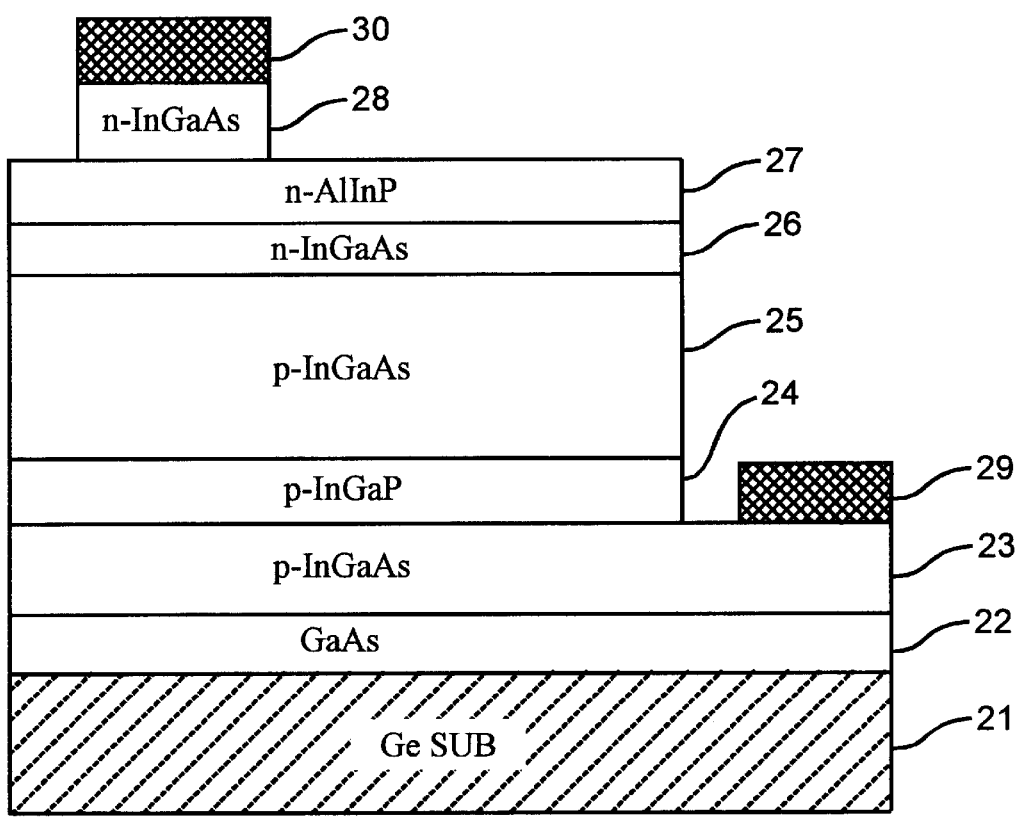
FIG. 1 is a schematic sectional view showing a structure of a single junction $In_{0.01}Ga_{0.99}As$ solar cell according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thickness are arbitrarily drawn for facilitating the reading of the drawings. In the following description, numerous specific details are set forth to provide a through understanding of the present invention. However, it will be obvious to those skilled in the art that the present invention may be practiced without such specific details.

(First Embodiment)

FIG. 1 is a schematic sectional view showing a structure of a single junction $In_xGa_{1-x}As$ solar cell according to a first embodiment of the present invention. As shown in FIG. 1, the single junction $In_xGa_{1-x}As$ ($0.005 \leq x \leq 0.015$) solar cell according to the first embodiment of the present invention is constructed by depositing a relatively thick $In_xGa_{1-x}As$ ($0.005 \leq x \leq 0.015$) buffer layer 23 of about 2 to 3 μm thickness on a Ge substrate 21, which has a thickness of about 150 to 350 μm and has a (100) plane being set off by 5 to 9° to the [011] direction, via a thin low temperature GaAs buffer layer 22, which has a thickness of less than about 0.05 to 0.1 μm, and then arranging an $In_xGa_{1-x}As$ ($0.005 \leq x \leq 0.015$) solar cell layer thereon. The $In_xGa_{1-x}As$ ($0.005 \leq x \leq 0.015$) buffer layer 23 is a p-type (Zn-doped) layer having an impurity concentration of $5 \times 10^{18}$ cm$^{-3}$.

The $In_xGa_{1-x}As$ ($0.005 \leq x \leq 0.015$) solar cell layer is constructed by stacking a p-type $In_{0.49}Ga_{0.51}P$ back surface field layer 24, a p-type first $In_xGa_{1-x}As$ ($0.005 \leq x \leq 0.015$) layer 25, an n-type second $In_xGa_{1-x}As$ ($0.005 \leq x \leq 0.015$) layer 26, an n-type aluminum indium phosphide (AlInP) window layer 27, and an $In_xGa_{1-x}As$ ($0.005 \leq x \leq 0.015$) contact layer 28 in sequence from the bottom. The p-type $In_{0.49}Ga_{0.51}P$ back surface field layer 24 is a Zn-doped layer whose thickness is 0.03 to 0.3 μm, preferably 0.05 to 0.1 μm, and whose impurity concentration is $2 \times 10^{18}$ cm$^{-3}$. The p-type first $In_xGa_{1-x}As$ ($0.005 \leq x \leq 0.015$) layer 25 is a Zn-doped layer whose thickness is 1 to 5 μm, preferably 2.5 to 3.5 μm, and whose impurity concentration is $1 \times 10^{15}$ to $3 \times 10^{17}$ cm$^{-3}$. The n-type second $In_xGa_{1-x}As$ ($0.005 \leq x \leq 0.015$) layer 26 is a Si-doped layer whose thickness is 0.02 to 1 μm, preferably 0.05 to 0.2 μm, and whose impurity concentration is $1 \times 10^{15}$ to $4 \times 10^{18}$ cm$^{-3}$, for example, $2 \times 10^{18}$ cm$^{-3}$. The first $In_xGa_{1-x}As$ layer 25 and the second $In_xGa_{1-x}As$ layer 26 form a first pn junction. For example, the p-type first $In_xGa_{1-x}As$ layer 25 is a p-type $In_{0.01}Ga_{0.99}As$ base layer 25 having impurity concentration of $1\times10^{17}$ cm$^{-3}$. And the second $In_xGa_{1-x}As$ layer 26 is an n-type $In_{0.01}Ga_{0.99}As$ emitter layer 26 having impurity concentration of $2\times10^{18}$ cm$^{-3}$. The n-type AlInP window layer 27 is a layer whose thickness is 0.03 to 0.1 μm, and the $In_xGa_{1-x}As$ ($0.005 \leq x \leq 0.015$) contact layer 28 is a $In_{0.01}Ga_{0.99}As$ layer, for example, whose thickness is 0.2 to 0.5 μm. Then, "a surface electrode 30" made of Au—Ge/Ni/Au layer is provided on the $In_{0.01}Ga_{0.99}As$ contact layer 28, and "a back surface electrode 29" made of Au—Zn/Au layer is provided on the $In_{0.01}Ga_{0.99}As$ buffer layer 23 which is exposed from a bottom portion of a recess portion. The surface electrode 30 is the cathode electrode and the back surface electrode 29 is the anode electrode.

In the pn junction semiconductor solar cell consisting of the n-type $In_{0.01}Ga_{0.99}As$ emitter layer 26 and the p-type $In_{0.01}Ga_{0.99}As$ base layer 25, as shown in FIG. 1, the light enters into the n-type $In_{0.01}Ga_{0.99}As$ emitter layer 26, then photons absorbed by the underlying p-type $In_{0.01}Ga_{0.99}As$ base layer 25 generate the electron-hole pairs, then the electrons as the minority carrier travel by the diffusion, and then such electrons flow into the n-type $In_{0.01}Ga_{0.99}As$ emitter layer 26 because of the high electric field of the depletion layer to generate the current when they reach the depletion layer on the p-n interface. However, some of the electrons generated in the p-type $In_{0.01}Ga_{0.99}As$ base layer 25 enter into the back surface electrode 29, and such electrons can no longer return to the p-type $In_{0.01}Ga_{0.99}As$ base layer 25. Therefore, such electrons are combined with the holes as the majority carrier to disappear anyhow, and do not generate the current. In order to prevent such back surface recombination loss, the p-type $In_{0.49}Ga_{0.51}P$ back surface field layer 24 is provided under the p-type $In_{0.01}Ga_{0.99}As$ base layer 25 not to bring the minority carriers (electrons) generated in the p-type $In_{0.01}Ga_{0.99}As$ base layer 25 near to the back surface electrode 29 as much as possible. The p-type InGaP back surface field layer 24 acts as the energy band barrier against the minority carriers generated in the p-type $In_{0.01}Ga_{0.99}As$ base layer 25. As the back surface field base layer, InGaP which has the band gap Eg wider than $In_{0.01}Ga_{0.99}As$ used as the base layer material and also acts as the barrier against the minority carrier is employed. Since the conduction band of the p-type $In_{0.01}Ga_{0.99}As$ base layer 25 is increased abruptly at the interface to the back surface field layer 24 by the back surface field layer, the electrons as the minority carriers are repelled by such barrier and do not travel further more. In this case, the barrier may be formed against the minority carrier by increasing the doping concentration of $In_{0.01}Ga_{0.99}As$ that is the same material as the base layer 25. In order to obtain the satisfactory barrier against the minority carrier by this method, the doping concentration of the back surface field layer must be set extremely high. This seldom causes the problem in the case of the single junction solar cell. In contrast, if such high concentration doping layer is employed as the top cell back surface field layer of the stacked type solar cell in which the solar cells are connected in series (tandem) to obtain the high output voltage, such doping layer is not preferable since infrared absorption is caused by the high concentration majority carriers in the high concentration doping layer to occasion the large energy loss.

Figure 2:
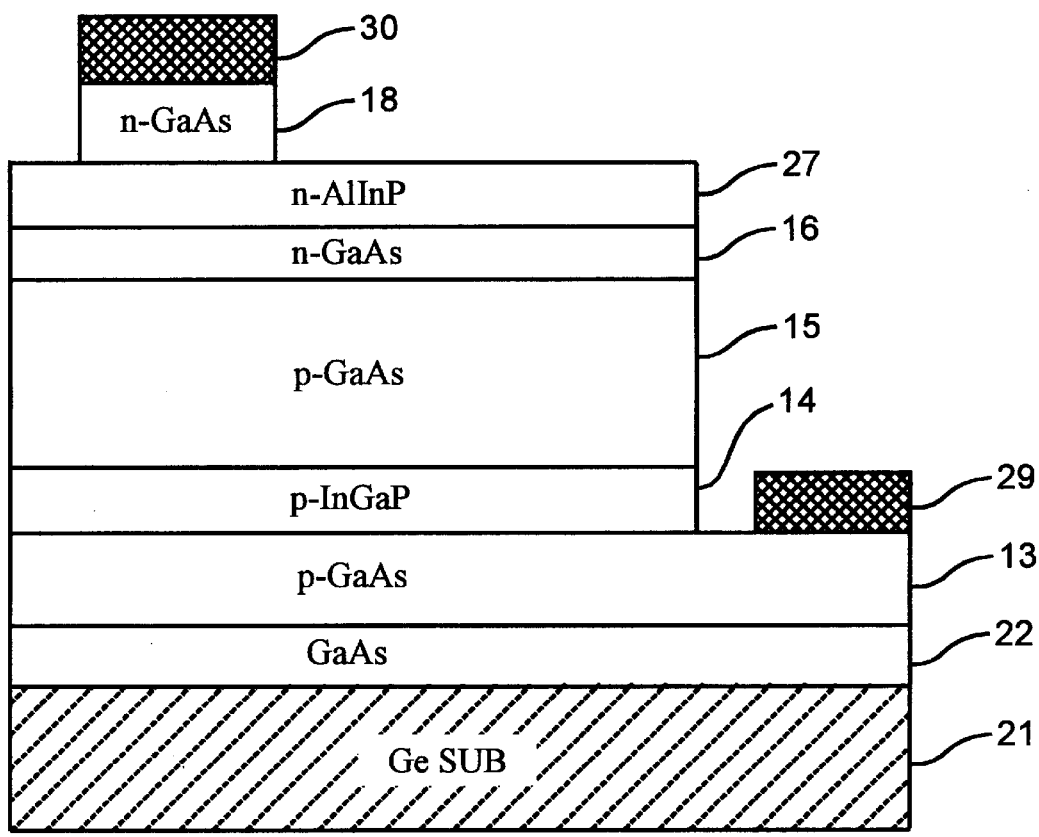
FIG. 2 is a schematic sectional view showing a structure of a single junction solar cell as a comparative example.

FIG. 2 shows a comparative structure of a GaAs solar cell, which is illustrated to compare with the single junction $In_{0.01}Ga_{0.99}As$ solar cell according to the first embodiment of the present invention shown in FIG. 1. A low temperature GaAs buffer layer 22 like FIG. 1 is arranged by 0.1 μm in thick on a Ge substrate 21 as the first layer, and a relatively thick (2 to 3 μm) GaAs buffer layer 13 (p-type Zn-doped, $5\times10^{18}$ cm$^{-3}$) is arranged thereon. Then, a GaAs solar cell layer is arranged on the GaAs buffer layer 13. The GaAs solar cell layer consists of a p-type $In_{0.48}Ga_{0.52}P$ back surface field layer 14 (Zn-doped, $2\times10^{18}$ cm$^{-3}$), a p-type GaAs base layer 15 (Zn-doped, $1\times10^{17}$ cm$^{-3}$), an n-type GaAs emitter layer 16 (Si-doped, $2\times10^{18}$ cm$^{-3}$), and an n-type AlInP window layer 27 from the bottom. Also, like FIG. 1, the surface electrode (Au—Ge/Ni/Au) 30 is provided on the GaAs contact layer 18, and the back surface electrode (Au—Zn/Au) 29 is provided on the GaAs buffer layer 13.

Figure 3A:
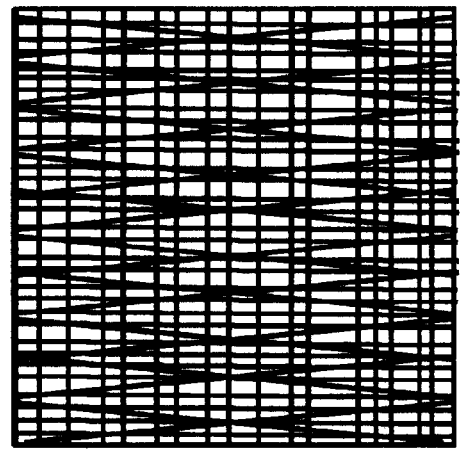
FIG. 3A shows surface morphology of the GaAs solar cell as the comparative example shown in FIG. 2.
Figure 3B:
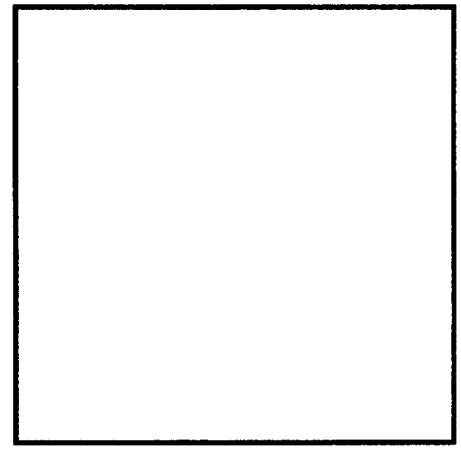
FIG. 3B shows the surface morphology in the case of x=0.007.
Figure 3C:
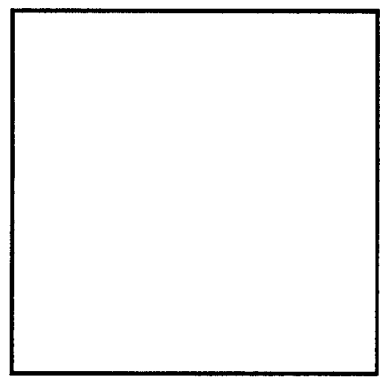
FIG. 3C shows the surface morphology of the $In_{0.01}Ga_{0.99}As$ solar cell according to the present invention.

FIG. 3A illustrates the surface morphology of the GaAs solar cell as the comparative example, whose schematic sectional view was already shown in FIG. 2, and FIG. 3C shows the surface morphology of the $In_{0.01}Ga_{0.99}As$ solar cell according to the present invention. As shown in FIG. 3A, lattice-like undulation patterns due to the misfit dislocation are observed on the surface of the GaAs solar cell as the comparative example. In contrast, no lattice-like undulation pattern is observed on the surface of the $In_{0.01}Ga_{0.99}As$ solar cell according to the present invention.

Figure 3D:
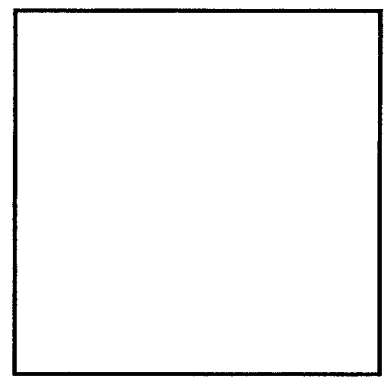
FIG. 3D shows the surface morphology in the case of x=0.014.
Figure 3E:
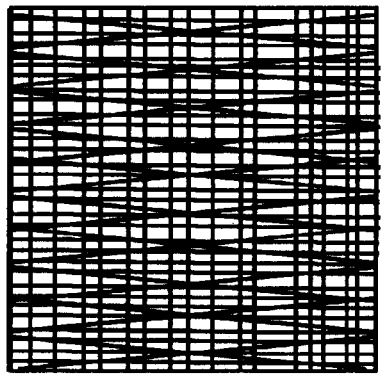
FIG. 3E shows the surface morphology in the case of x=0.02.

FIG. 3B shows the surface morphology for the case of x=0.007, and FIG. 3D and FIG. 3E show the surface morphologies for the cases of x=0.014 and x=0.02 respectively, with x value corresponding to the In composition in the $In_xGa_{1-x}As$ crystal. The lattice mismatching ratios are −0.08% at composition x=0, −0.03% at composition x=0.007, 0% at composition x=0.01, +0.05% at composition x=0.014, and +0.1% at composition x=0.02 respectively. It can be understood that, if the composition x of In is in the range of $0.007 \leq x \leq 0.014$, the good surface morphology can be obtained. According to more detailed examination, it can be understood that, if the composition x of In contained in the p-type $In_xGa_{1-x}As$ base layer 25 and the n-type $In_xGa_{1-x}As$ emitter layer 26 is in the range of $0.005 \leq x \leq 0.015$, the good surface morphology can be obtained.

Figure 4:
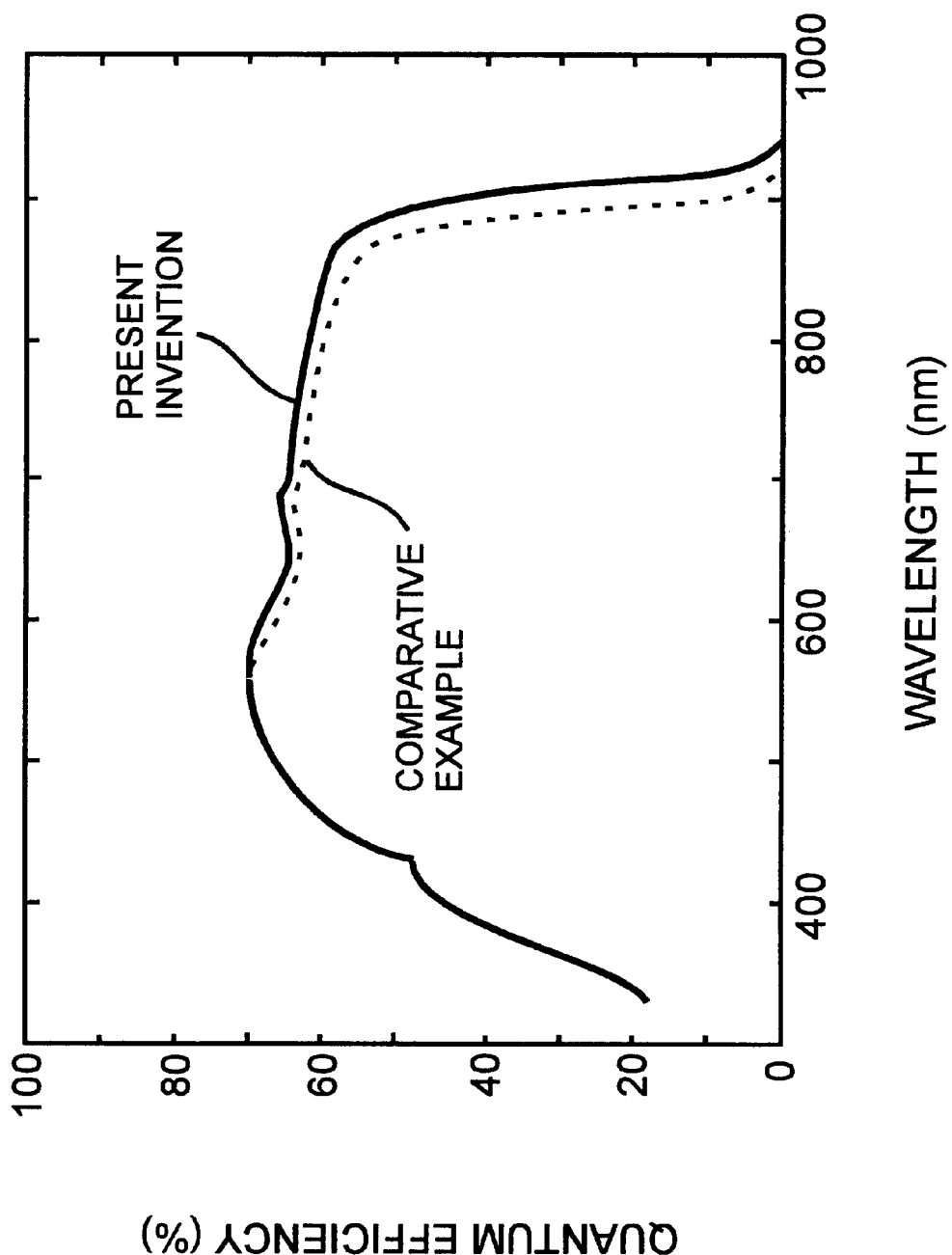
FIG. 4 is a view showing the comparison of spectral sensitivity characteristics between the GaAs solar cell according to the comparative example and the $In_{0.01}Ga_{0.99}As$ solar cell according to the present invention.

FIG. 4 shows spectral sensitivity characteristics of the GaAs solar cell according to the comparative example shown in FIG. 2 and the $In_{0.01}Ga_{0.99}As$ solar cell according to the present invention shown in FIG. 1. According to the comparison of the spectral sensitivity characteristics in FIG. 4, it can be understood that, since the band gap Eg is changed from 1.42 eV to 1.40 eV by adding In to GaAs to obtain $In_{0.01}Ga_{0.99}As$, the optical absorption edge is changed from 873 nm to 885 nm and thus the $In_{0.01}Ga_{0.99}As$ solar cell can have its sensitivity on the longer wavelength side.

Figure 5A:
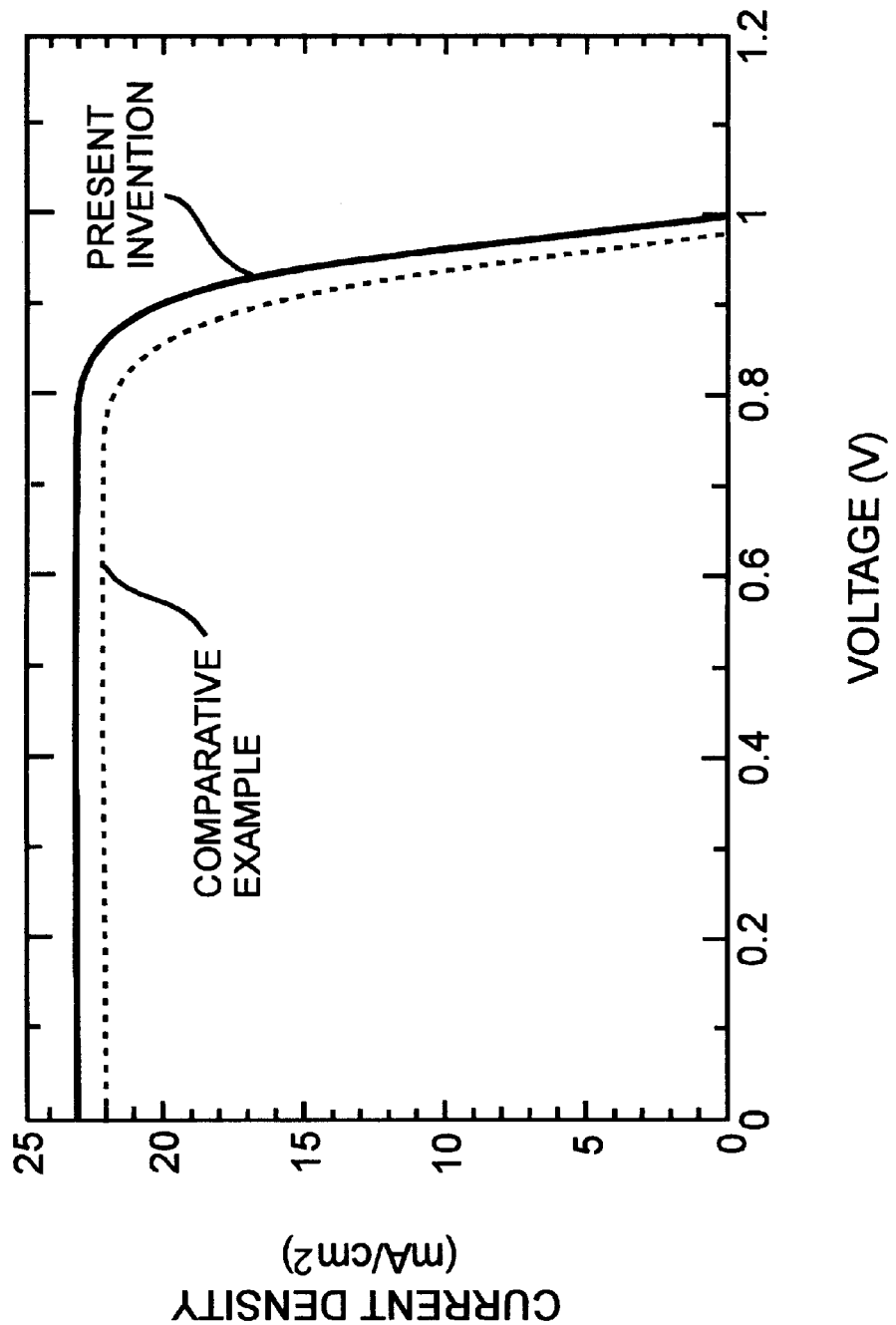
FIG. 5A is a view showing current-voltage characteristics of the GaAs solar cell as the comparative example in FIG. 2 and the $In_{0.01}Ga_{0.99}As$ solar cell according to the present invention in FIG. 1 under the light irradiation.

FIG. 5A shows current-voltage characteristics of the GaAs solar cell as the comparative example shown in FIG. 2 and the $In_{0.01}Ga_{0.99}As$ solar cell according to the present invention shown in FIG. 1 under the light irradiation. FIG. 5B is a table comparing the characteristics of the GaAs solar cell according to the comparative example with that of the $In_{0.01}Ga_{0.99}As$ solar cell according to the first embodiment for the purpose of comparison. As shown in FIG. 5B, the short circuit current Jsc of the GaAs solar cell is 22.12 mA/cm$^2$, while the short circuit current Jsc of the $In_{0.01}Ga_{0.99}As$ solar cell is 23.01 mA/cm$^2$. Thus, it can be understood that the short circuit current Jsc can be increased by about 1 mA/cm$^2$ by adopting the structure of the $In_{0.01}Ga_{0.99}As$ solar cell according to the first embodiment of the present invention. Also, the fill factor is increased from 80.9% to 83.31%.

Here, a noteworthy point resides in that, in FIG. 5A and FIG. 5B, the open circuit voltage Voc of the GaAs solar cell is 0.983V whereas the open circuit voltage Voc of the $In_{0.01}Ga_{0.99}As$ solar cell is 0.997 V, and thus the open circuit voltage Voc of the $In_{0.01}Ga_{0.99}As$ solar cell can be increased rather than the open circuit voltage Voc of the GaAs solar cell. This is a remarkable effectiveness achieved by the present invention.

Since $In_{0.01}Ga_{0.99}As$ has the band gap Eg smaller than GaAs, the theoretical open circuit voltage Voc should become larger in GaAs. In order to explain the reason why the open circuit voltage Voc of the $In_{0.01}Ga_{0.99}As$ solar cell can be increased rather than the open circuit voltage Voc of the GaAs solar cell contrary to the theoretical prediction, the crystallographic estimations must be taken account of. In other words, the GaAs solar cell according to the comparative example has a number of misfit dislocations and thus has the lower open circuit voltage Voc, but the $In_{0.01}Ga_{0.99}As$ solar cell according to the first embodiment of the present invention improves the open circuit voltage Voc regardless of the small band gap Eg because the misfit dislocations are remarkably reduced. Actually, as can be seen from the surface morphology shown in FIG. 3A, the misfit dislocations exist in the GaAs solar cell fabricated on the Ge to cause reduction in the open circuit voltage Voc. On the contrary, in the case of the $In_xGa_{1-x}As$ solar cell whose composition x of In on the Ge is in the range of $0.007 \leq x \leq 0.014$, the good surface morphologies shown in FIG. 3B to FIG. 3D can be achieved and thus the dislocation seldom exists. That is, it may be concluded that, since the good crystal quality can be achieved in the $In_xGa_{1-x}As$ solar cell on the Ge, the high open circuit voltage Voc can be obtained. Consequently, the conversion efficiency η of the GaAs solar cell (without the reflection preventing film) fabricated on the Ge substrate is 17.6% whereas the conversion efficiency η of 19.1% can be obtained in the $In_xGa_{1-x}As$ solar cell in which the specific composition x of In is added to GaAs.

The single junction $In_{0.01}Ga_{0.99}As$ solar cell according to the first embodiment of the present invention can be fabricated by a manufacturing method described in the following.

(a) To begin with, the low temperature buffer layer 22 is deposited on the Ge substrate 21 at the relatively low temperature of 500 to 650° C., preferably at about 600° C. by the MOCVD method, the CBE method, the MBE method, the ALE method, the MLE method, or the like. For example, either of the atmospheric pressure MOCVD (AP-MOCVD) and the low pressure MOCVD (LP-MOCVD) may be employed as the MOCVD method, but preferably the LP-MOCVD method whose pressure is held at 6.7 to 10 kPa, more preferably the vertical LP-MOCVD method should be employed. Triethylgallium (TEG), trimethylgallium (TMG), or the like may be employed as the group III material gas, and arsine ($AsH_3$), tertiarybutylarsine (($C_4H_9$)$AsH_2$; TBA), or the like may be employed as the group V material gas.

(b) Then, continuous multi-layer epitaxial growth of the $In_{0.01}Ga_{0.99}As$ buffer layer 23, the p-type $In_{0.49}Ga_{0.51}P$ back surface field layer 24, the p-type $In_{0.01}Ga_{0.99}As$ base layer 25, the n-type $In_{0.01}Ga_{0.99}As$ emitter layer 26, the n-type AlInP window layer 27, and the $In_{0.01}Ga_{0.99}As$ contact layer 28 on the low temperature buffer layer 22 is carried out. In this continuous multi-layer epitaxial growth, the MOCVD method, the CBE method, the MBE method, the ALE method, the MLE method, or the like may be employed, like the above. For example, the vertical LP-MOCVD method whose pressure is held at 6.7 to 10 kPa may be employed, as in the growth of the low temperature buffer layer 22. In order to grow the $In_{0.01}Ga_{0.99}As$ buffer layer 23, the $In_{0.01}Ga_{0.99}As$ base layer 25, and the $In_{0.01}Ga_{0.99}As$ emitter layer 26, trimethylindium (TMI: $In(CH_3)_3$), TEG, or the like may be employed as the group III material gas, and $AsH_3$, TBA, or the like may be employed as the group V material gas. In order to grow the $In_{0.49}Ga_{0.51}P$ back surface field layer 24, TMI, TEG, or the like may be employed as the group III material gas, and phosphine ($PH_3$), tertiarybutylphosphine (($C_4H_9$)$PH_2$; TBP), or the like may be employed as the group V material gas. Also, in order to grow the AlInP window layer 27, trimethylaluminum (TMA: $Al(CH_3)_3$), TMI, or the like may be employed as the group III material gas, and $PH_3$, TBP, or the like may be employed as the group V material gas. In addition, monosilane ($SiH_4$), disilane ($Si_2H_6$), diethylselenium (DESe), diethyl tellurium (DETe), or the like may be employed as the n-type dopant gas, but monosilane is preferable. Carbon tetrabromide ($CBr_4$) or diethylzinc (DEZn) can be employed as the p-type dopant gas. Otherwise, carbon in TMG may be employed as the p-type dopant gas. These source gases and the dopant gases are introduced into the reaction tube, whose pressure is lowered to 6.7 to 10 kPa, by using mass flow controllers, etc. A ratio of the group V material gas to the group III material gas, i.e., "a V/III ratio" may be set to about 20 to 200, for example. The substrate temperature in growth may be set to the temperature that is higher than the substrate temperature of the low temperature buffer layer 22, e.g., 650 to 750° C., and preferably 650 to 700° C. In particular, in order to obtain the high fill factor (FF) value as shown in FIGS. 5A and 5B, preferably the substrate temperature in the continuous epitaxial growth of the p-type $In_{0.01}Ga_{0.99}As$ base layer 25, the n-type $In_{0.01}Ga_{0.99}As$ emitter layer 26, etc. should be set to 700° C.

(c) Then, the Ge substrate 21 on which the multi-layered structure is stacked by the continuous epitaxial growth is unloaded from the reaction tube, then the photoresist film, scheduled to be used in the lift-off process, is coated. Then the predetermined pattern is formed by the photolithography, and then the Au—Ge/Ni/Au film is formed thereon by the vacuum evaporation. For example, an Au—Ge film of 100 nm thickness (12 wt %), a Ni film of 20 nm thickness, and an Au film of 20 nm thickness are formed by the EB evaporation method. Then, by removing (lifting-off) the photoresist film, as shown in FIG. 1, the pattern of the surface electrode 30 is delineated. Although a plan view is omitted, the upper electrode may be formed to have a predetermined pattern profile such as comb-like stripes, etc. which enables to introduce effectively the solar light. The pattern of the surface electrode 30 shown in FIG. 1 can be obtained by etching using the etchant such as $KI/I_2$ solution based on the normal photolithography in place of the lift-off method, but the lift-off method is simple. Then, sintering of the electrode is performed at the substrate temperature of 350 to 450° C. in the hydrogen gas ($H_2$) ambient or the inert gas atmosphere such as the nitrogen gas ($N_2$), argon (Ar), helium (He) ambient, or the like. For example, it is preferable that the sintering should be performed at 350° C. for about several seconds by the rapid thermal anneal (RTA) employing a infra red lamp. Then, the gold (Au) plating layer is formed selectively thereon by the electrolytic plating to complete the surface electrode 30.

(d) Then, the n-type AlInP window layer 27 is exposed by etching the n-type $In_{0.01}Ga_{0.99}As$ contact layer 28 while using the surface electrode 30 as a mask. Then, a silicon oxide film ($SiO_2$ film) of 0.03 to 1 μm thickness is deposited on the exposed n-type AlInP window layer 27 and also on the surface electrode 30 by the CVD method. Then, photoresist film is coated on the $SiO_2$ film, and then the pattern having an opening portion through which a groove, on the bottom of the groove the back surface electrode 29 is scheduled to be deposited, is formed. An etching mask for the groove, or the back-surface-electrode-forming groove, is delineated by patterning the $SiO_2$ film by the reactive ion etching(RIE), etc. while using the photoresist film as a mask. Otherwise, only the single layer of photoresist mask may be used as the etching mask for the groove, not employing the $SiO_2$ film. Then, a part of the p-type $In_{0.01}Ga_{0.99}As$ buffer layer 23 is exposed by etching the n-type $In_{0.01}Ga_{0.99}As$ contact layer 28, the n-type AlInP window layer 27, the n-type $In_{0.01}Ga_{0.99}As$ emitter layer 26, the p-type $In_{0.01}Ga_{0.99}As$ base layer 25, and the p-type $In_{0.49}Ga_{0.51}P$ back surface field layer 24, by using the $NH_4OH:H_2O_2:H_2O$ solution (e.g., 1:1:10 or 2:1:50 solution) and the HCl solution while using the $SiO_2$/photoresist double layer mask or the photoresist single layer mask The p-type InGaP back surface field layer 24 functions as an etching stopper. The p-type InGaP back surface field layer 24 is exposed by the etching of the $NH_4OH:H_2O_2:H_2O$ solution. Otherwise, the etching may be carried out by the RIE method using the etching gas such as $BCl_3$, $SiCl_4$, etc. Next, the p-type InGaP back surface field layer 24 is etched selectively by using the hydrogen halide based etchant ($HCl:H_2O$, $HCl:H_3PO_4$, $HBr:H_2O$ or $HBr:H_3PO_4$, etc.). The p-type $In_{0.01}Ga_{0.99}As$ buffer layer 23 functions as the etching stopper in the etching using the hydrogen halide etchant, and thus the p-type $In_{0.01}Ga_{0.99}As$ buffer layer 23 is exposed. In the etching of the p-type InGaP back surface field layer 24, such a method may be employed that the etching mask pattern is formed on the p-type back surface field layer 24 by the photolithography method. Alternatively, an etching mask is formed on a sidewall of the groove by a self-alignment manner, after depositing some etching-resistive material on the sidewall of the groove, and then the etching is performed employing the sidewall mask, without using the photolithography method.

(e) Then, the Au—Zn film for the back surface electrode 29 is vacuum-evaporated only on a predetermined portion by using the lift-off method. The photoresist film, etc. which are employed in etching the p-type InGaP back surface field layer 24 may be employed once again as the lift-off mask pattern. After the Au—Zn film has been formed on the predetermined portion, the Au plating film is deposited only on the Au—Zn film by the selective plating method (electrolytic plating) to complete the back surface electrode 29.

In the above manufacturing steps, further a reflection preventing film may be formed on the n-type AlInP window layer 27 by sputtering or vacuum-evaporating a zinc sulfide (ZnS) film and a magnesium fluoride ($MgF_2$) film using the lift-off method. The solar cell according to the first embodiment of the present invention does not require forming an electrode on the bottom surface of the substrate 21. Therefore, after a cover glass is provided on the solar cell having the structure shown in FIG. 1, the cell back surface, or the bottom surface of the substrate 21, can be removed by the polishing or the etching without the precise control. Since the processes such as the step of forming the back surface electrode after the cell back surface has been removed are if not needed, the solar cell of the present invention has a structure that needs easy steps of reducing the weight and is suitable for the space solar cell.

However, the anode or cathode electrode may be formed on the bottom surface of the substrate. Indium (In), etc. may be employed as an anode electrode material for the p-type Ge substrate, and Au—Ge, etc. may be employed as cathode electrode material for the n-type Ge substrate. In this case, there is such an advantage that the photolithography step for patterning the top surface side can be omitted.

(Second Embodiment)

Figure 6:
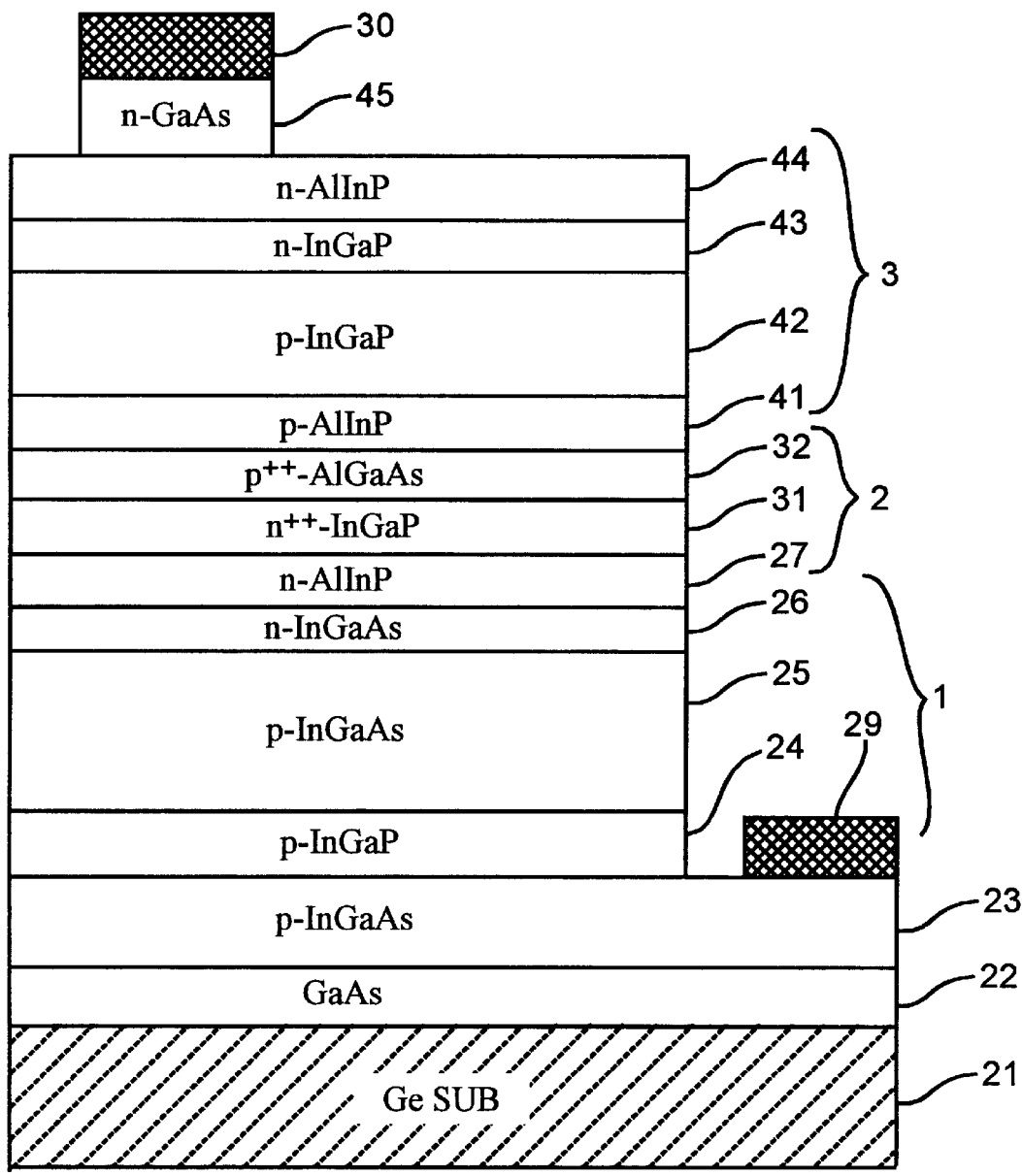
FIG. 6 is a schematic sectional view showing a structure of a multi-junction solar cell according to a second embodiment of the present invention.

FIG. 6 is a schematic sectional view showing a multi-junction solar cell according to a second embodiment of the present invention. The conversion efficiency (power generating efficiency) of the so-called single junction solar cell having only one pn junction has the particular theoretical limitation determined by the band gap Eg of the semiconductor material. For this reason, it is known that the conversion efficiency of about 30% seems to be the limitation under the solar light irradiation condition on the earth whichever semiconductor material is employed. Hence, for the purpose of attaining the conversion efficiency higher than the single junction solar cell, various multi-junction solar cells in which two solar cells or more having different wavelength response characteristics are stacked have been proposed.

Simplest one of the multi-junction solar cells is a two-junction (tandem) solar cell. The two-junction solar cell has a structure in which a solar cell on the light incoming side ("top cell") and another solar cell on the opposite side ("bottom cell") are stacked. Normally the band gap $Eg_1$ of the semiconductor material of the top cell is set larger than the band gap $Eg_2$ of the semiconductor material of the bottom cell. Here, it is intended that the top cell can absorb photons having the larger energy than $Eg_1$ and the bottom cell can absorb the photons having the energy between $Eg_2$ and $Eg_1$ in the light transmitted through the top cell. The high conversion efficiency can be achieved by selecting appropriately the combination of $Eg_2$ and $Eg_1$.

As shown in FIG. 6, a multi-junction solar cell layer 2 according to the second embodiment of the present invention is a two-junction solar cell in which the p-type $In_xGa_{1-x}As$ ($0.005 \leq x \leq 0.015$) buffer layer 23 whose thickness is 2 to 3 $\mu$m and whose impurity concentration is $5 \times 10^{18}$ cm$^{-3}$ is deposited on the Ge substrate 21, which has a thickness of about 150 to 350 $\mu$m and has a (100) plane being set off by 5 to 9°, via the low temperature GaAs buffer layer 22, which has a thickness of 0.1 $\mu$m, and then an $In_xGa_{1-x}As$ ($0.005 \leq x \leq 0.015$) bottom cell 1, a very heavily doped InGaP/AlGaAs tunnel junction layer (first tunnel junction layer) 2, and an InGaP top cell 3 are deposited sequentially thereon. Thus, the two-junction solar cell has three pn junctions including the tunnel junction.

The $In_xGa_{1-x}As$ ($0.005 \leq x \leq 0.015$) bottom cell 1 is constructed by arranging the p-type $In_{0.49}Ga_{0.51}P$ back surface field layer 24 on the $In_xGa_{1-x}As$ ($0.005 \leq x \leq 0.015$) buffer layer 23, and then arranging the p-type $In_xGa_{1-x}As$ ($0.005 \leq x \leq 0.015$) base layer (first $In_xGa_{1-x}As$ layer) 25 whose thickness is 3 $\mu$m and whose impurity concentration is $2.0 \times 10^{17}$ cm$^{-3}$, the n-type $In_xGa_{1-x}As$ ($0.005 \leq x \leq 0.015$) emitter layer (second $In_xGa_{1-x}As$ layer) 26 whose thickness is 0.1 $\mu$m and whose impurity concentration is $2.0 \times 10^{18}$ cm$^{-3}$, and the n-type AlInP window layer 27 whose thickness is 0.05 $\mu$m and whose impurity concentration is $1.0 \times 10^{19}$ cm$^{-3}$ in sequence thereon. The n-type $In_xGa_{1-x}As$ ($0.005 \leq x \leq 0.015$) emitter layer 26 and the p-$In_xGa_{1-x}As$ ($0.005 \leq x \leq 0.015$) base layer 25 constitute the first pn junction.

The InGaP/AlGaAs tunnel junction layer (first tunnel junction layer) 2 is constructed by stacking a very heavily doped $n^{++}$-type InGaP layer 31, whose thickness is 15 nm and whose impurity concentration is more than $5 \times 10^{18}$ cm$^{-3}$ (e.g., $1 \times 10^{19}$ cm$^{-3}$) and a very heavily doped $p^{++}$-type AlGaAs layer 32, whose thickness is 15 nm and whose impurity concentration is $1.0\times10^{19}$ cm$^{-3}$, on the n-type AlInP window layer 27 as the uppermost layer of the lower cell (In$_x$Ga$_{1-x}$As ($0.005 \leq x \leq 0.015$) bottom cell) 1.

Then, the InGaP top cell 3 is constructed by depositing a p-type AlInP back surface field layer 41 whose thickness is 30 nm and whose impurity concentration is $1.0\times10^{18}$ cm$^{-3}$, a p-type InGaP base layer 42 whose thickness is 0.5 to 1.5 $\mu$m and whose impurity concentration is $1.5\times10^{17}$ cm$^{-3}$, an n-type InGaP emitter layer 43 whose thickness is 50 $\mu$m and whose impurity concentration is $2.0\times10^{18}$ cm$^{-3}$, and an n-type AlInP window layer 44 whose thickness is 30 nm and whose impurity concentration is $2.0\times10^{18}$ cm$^{-3}$ in sequence on the InGaP/AlGaAs tunnel junction layer 2. The n-type InGaP emitter layer 43 and the p-type InGaP base layer 42 constitute the second pn junction. In this case, since the p-type InGaP base layer 42 is relatively thin, the severe limitation is not required for the lattice constant. But it is preferable that the composition In$_{0.496}$Ga$_{0.504}$P should be achieved.

An n-type GaAs contact layer 45 of 0.3 $\mu$m thickness for ohmic contact is formed on a part of the InGaP top cell 3, and then the surface electrode 30 consisting of the Au—Ge/Ni/Au film and the Au film thereon is formed as a cathode electrode thereon. Also, a recessed portion is formed by etching a part of the In$_x$Ga$_{1-x}$As ($0.005 \leq x \leq 0.015$) bottom cell 1, i.e., the n-type AlInP window layer 27, the n-type In$_x$Ga$_{1-x}$As ($0.005 \leq x \leq 0.015$) emitter layer 26, the p-type In$_x$Ga$_{1-x}$As ($0.005 \leq x \leq 0.015$) base layer 25, and the p-type InGaP back surface field layer 24 through the InGaP top cell 3 and the InGaP/AlGaAs tunnel junction layer 2. The back surface electrode (Au—Zn/Au) 29 is provided on the In$_x$Ga$_{1-x}$As ($0.005 \leq x \leq 0.015$) buffer layer 23 that is exposed from the bottom portion of the recess portion as a anode electrode.

FIG. 7 is a table showing characteristics of the two-junction solar cell, in which the bottom cell 1 is formed of In$_{0.01}$Ga$_{0.99}$As and the top cell 3 is formed of InGaP according to the second embodiment of the present invention. FIG. 7 also includes characteristics of the two-junction solar cell of the comparative example, for the purpose of comparison. The comparative is a two-junction solar cell, in which the bottom cell is formed of GaAs and the top cell is formed of In$_{0.48}$Ga$_{0.52}$As. As shown in FIG. 7, the open circuit voltage Voc is increased from 2.357 V to 2.389 V. The reason for this increase of the open circuit voltage Voc can be guessed such that the structure of the two-junction solar cell shown in FIG. 6, according to the second embodiment, can reduce the misfit dislocation.

In addition, since In$_{0.01}$Ga$_{0.99}$As of the bottom cell 1 has the band gap Eg smaller than GaAs, the margin in selecting top cell material can be improved in the two-junction solar cell. Thus, the wavelength spectrum band that can contribute the substantial power generation can be increased and also the high conversion efficiency can be achieved. Therefore, as shown in FIG. 7, the conversion efficiency η obtained when the reflection preventing film is formed is increased from 27.31% to 30.90%. Moreover, by employing the structure of the two-junction solar cell shown in FIG. 6 according to the second embodiment, the short circuit current Jsc can be increased from 13.73 mA/cm$^2$ to 15.20 mA/cm$^2$ and the fill factor (FF) is increased from 84.4% to 85.1%.

Besides, since the solar cell according to the second embodiment employs the Ge substrate 21, the problem of the increase in the resistivity of the substrate due to the radiation irradiation is not caused. Further, since the back surface electrode is not provided on the bottom surface of the Ge substrate 21, the back surface of the two-junction solar cell of the second embodiment can be worked freely, after the solar cell has been completed. Accordingly, if the solar cell is employed as a single body not to construct the mechanical stacked solar cell, the lighter weight can be easily achieved by polishing the bottom surface of the Ge substrate 21, etc. That is, since the solar cell according to the second embodiment is excellent in the radiation immunity characteristic and can reduce the weight, it is preferable for the space applications such as the power generating apparatus mounted in the artificial satellite, etc.

(Other Embodiments)

Various modifications will become possible for those skilled in the art after receiving the teachings of the present disclosure without departing from the scope thereof. The multi-junction solar cell having three pn junctions is described in the second embodiment, it is apparent that the present invention is effective for a multi-junction solar cell which has more than three pn junctions by stacking the InGaP/InGaAs two-junction (tandem) solar cell and other solar cell.

Figure 8:
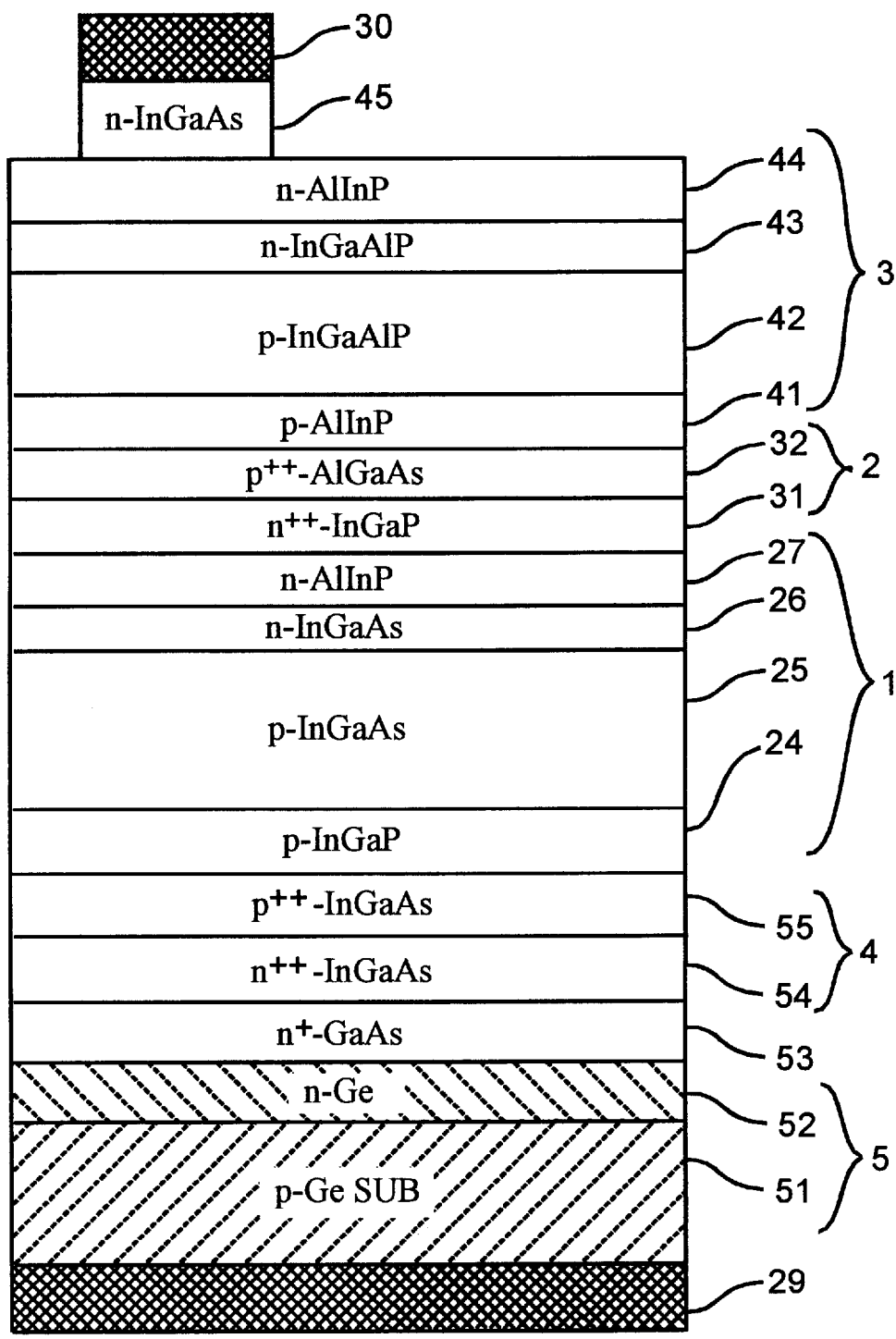
FIG. 8 is a schematic sectional view showing a structure of a three-junction solar cell according to other embodiment of the present invention.

For example, as shown in FIG. 8, a substrate side cell 5 may be formed by epitaxially growing an n-type Ge layer (second conductivity type Ge layer) 52 on a p-type Ge substrate (first conductivity type Ge substrate) 51 to constitute the third pn junction. Alternatively, the substrate side cell 5 may be formed by diffusing the n-type dopant (impurity atoms of second conductivity type) such as arsenic (As), phosphorus (P), etc. into the p-type Ge substrate 51 to constitute the third pn junction. A very heavily doped n$^{++}$-type In$_{0.01}$Ga$_{0.99}$As layer 54 is formed on the substrate side cell 5 via an n$^+$-type low temperature buffer layer 53. A very heavily doped p$^{++}$-type In$_{0.01}$Ga$_{0.99}$As layer 55 is formed on the n$^{++}$-type In$_{0.01}$Ga$_{0.99}$As layer 54. The n$^{++}$-type In$_{0.01}$Ga$_{0.99}$As layer 54 and the p$^{++}$-type In$_{0.01}$Ga$_{0.99}$As layer 55 constitute a substrate side tunnel junction layer (second tunnel junction layer) 4. Then, the p-type InGaP back surface field layer 24 of the bottom cell 1 is formed on the p$^{++}$-type In$_{0.01}$Ga$_{0.99}$As layer 55, whereby the three-junction solar cell can be constructed by depositing sequentially the In$_{0.01}$Ga$_{0.99}$As bottom cell 1, the InGaP/AlGaAs tunnel junction layer (first tunnel junction layer) 2, and the InGaAlP top cell 3. This three-junction solar cell has three pn junctions and two tunnel junction layers.

The In$_{0.01}$Ga$_{0.99}$As bottom cell 1 comprises the p-type In$_{0.49}$Ga$_{0.51}$P back surface field layer 24, the p-type In$_{0.01}$Ga$_{0.99}$As base layer (first In$_x$Ga$_{1-x}$As layer) 25, the n-type In$_{0.01}$Ga$_{0.99}$As emitter layer (second In$_x$Ga$_{1-x}$As layer) 26, and the n-type AlInP window layer 27. The InGaP/AlGaAs tunnel junction layer (first tunnel junction layer) 2 comprises the pn junction consisting of the n$^{++}$-type InGaP layer 31 of the lower cell and the p$^{++}$-type AlGaAs layer 32. The InGaAlP top cell 3 comprises the p-type AlInP back surface field layer 41, the p-type InGaAlP base layer 42, the n-type InGaAlP emitter layer 43, and the n-type AlInP window layer 44.

The n-type InGaAs contact layer 45 for ohmic contact is formed on a part of the InGaAlP top cell 3, and then the surface electrode 30 consisting of the Au—Ge/Ni/Au film and the Au film thereon is formed thereon. Also, the back surface electrode (Au—Zn/Au) 29 is provided on the back surface of the p-type Ge substrate 51.

As shown in FIG. 8, like the first and second embodiments, since the misfit dislocation can be reduced in the three-junction solar cell, the large open circuit voltage Voc can be obtained.

In addition, since $In_xGa_{1-x}As$ ($0.005 \leq x \leq 0.015$) has the band gap Eg smaller than GaAs, the margin in selecting constituent material can be improved in the multi-junction solar cell such that the band gap Eg is increased sequentially in the order of the substrate side cell 5, the $In_xGa_{1-x}As$ ($0.005 \leq x \leq 0.015$) bottom cell 1, and the InGaAlP top cell 3. Also, the wavelength spectrum band that can contribute the substantial power generation can be increased and thus the higher conversion efficiency can be achieved.

What is claimed is:

1. A solar cell comprising:
    a germanium substrate;
    a buffer layer formed on the germanium substrate;
    a first $In_xGa_{1-x}As$ layer of first conductivity type formed on the buffer layer, wherein a composition of Indium particular to the first $In_xGa_{1-x}As$ layer lies in a range between 0.005 and 0.015; and
    a second $In_xGa_{1-x}As$ layer of a second conductivity type formed on the first $In_xGa_{1-x}As$ layer to form a first pn junction with the first $In_xGa_{1-x}As$ layer, and the second $In_xGa_{1-x}As$ layer has a composition of Indium particular to the second $In_xGa_{1-x}As$ layer.

2. The solar cell of claim 1, wherein said first $In_xGa_{1-x}As$ layer has thickness of 1 to 5 $\mu$m.

3. The solar cell of claim 1, wherein the composition of Indium particular to said second $In_xGa_{1-x}As$ layer lies in the range between 0.005 and 0.015.

4. The solar cell of claim 3, wherein said second $In_xGa_{1-x}As$ layer has thickness of 0.05 to 0.2 $\mu$m.

5. The solar cell of claim 1, wherein said buffer layer comprises,
    a GaAs layer, and
    a third $In_xGa_{1-x}As$ layer formed on the GaAs layer, and the third $In_xGa_{1-x}As$ layer has a composition of Indium particular to the third $In_xGa_{1-x}As$ layer.

6. The solar cell of claim 5, wherein the composition of Indium particular to said third $In_xGa_{1-x}As$ layer lies in the range between 0.005 and 0.015.

7. The solar cell of claim 1, further comprising an $In_{0.49}Ga_{0.51}P$ back surface field layer of the first conductivity type disposed between said buffer layer and said first $In_xGa_{1-x}As$ layer.

8. The solar cell of claim 1, wherein said first pn junction is used for a bottom cell, the solar cell further comprising a top cell having a second pn junction, and the second pn junction is formed of semiconductor layers whose band gap is wider than said first $In_xGa_{1-x}As$ layer.

9. The solar cell of claim 8, wherein said second pn junction is formed of InGaP layers.

10. The solar cell of claim 8, further comprising a first tunnel junction layer disposed between said bottom and top cells.

11. The solar cell of claim 10, wherein said germanium substrate has the first conductivity type.

12. The solar cell of claim 11, further comprising a germanium layer of the second conductivity type, disposed on said germanium substrate so as to form a third pn junction with said germanium substrate, and the third pn junction is used as a substrate side cell.

13. The solar cell of claim 12, further comprising a second tunnel junction layer disposed between said bottom and substrate side cells.

14. A method for manufacturing a solar cell, comprising the steps of:
    epitaxially growing buffer layer on a germanium substrate;
    epitaxially growing a first $In_xGa_{1-x}As$ layer of a first conductivity type on the buffer layer, wherein a composition of Indium particular to the first $In_xGa_{1-x}As$ layer lies in a range between 0.005 and 0.015; and
    epitaxially growing a second $In_xGa_{1-x}As$ layer of a second conductivity type on the first $In_xGa_{1-x}As$ layer, and the second $In_xGa_{1-x}As$ layer has a composition of Indium particular to the second $In_xGa_{1-x}As$ layer.

15. The method of claim 14, wherein the composition of Indium particular to said second $In_xGa_{1-x}As$ layer lies in the range between 0.005 and 0.015.

16. The method of claim 14, wherein said step of epitaxially growing buffer layer comprises the steps of:
    epitaxially growing GaAs buffer layer on the germanium substrate; and
    epitaxially growing an $In_xGa_{1-x}As$ buffer layer on the GaAs buffer layer, and the $In_xGa_{1-x}As$ buffer layer has a composition of Indium particular to the $In_xGa_{1-x}As$ buffer layer.

17. The method of claim 16, wherein said GaAs buffer layer is grown at substrate temperature of about 500 to 650° C.

18. The method of claim 17, wherein said $In_xGa_{1-x}As$ buffer layer, said first $In_xGa_{1-x}As$ layer and said second $In_xGa_{1-x}As$ layer are grown at substrate temperature of 650 to 750° C.

19. The method of claim 14, wherein the germanium substrate has the first conductive type, comprising the additional step of diffusing impurity atoms of a second conductivity type into said germanium substrate before said step of epitaxially growing the buffer layer.

20. A solar cell comprising:
    a germanium substrate;
    a buffer layer formed epitaxially on the germanium substrate;
    a $In_xGa_{1-x}As$ layer of a first conductivity type formed epitaxially on the buffer layer, wherein a composition of Indium peculiar to the $In_xGa_{1-x}As$ layer lies in a range between 0.005 and 0.015; and
    a semiconductor layer of a second conductivity type formed on the $In_xGa_{1-x}As$ layer to form a first pn junction with the $In_xGa_{1-x}As$ layer.

21. The solar cell of claim 20, wherein said first pn junction is used for a bottom cell, the solar cell further comprising a top cell having a second pn junction, and the second pn junction is formed of semiconductor layers whose band gap is wider than said $In_xGa_{1-x}As$ layer.

22. The solar cell of claim 21, wherein said second pn junction is formed of InGaP layers.

23. The solar cell of claim 21, further comprising a first tunnel junction layer disposed between said bottom and top cells.

24. The solar cell of claim 23, wherein said germanium substrate has the first conductivity type.

25. The solar cell of claim 24, further comprising a germanium layer of the second conductivity type disposed on said germanium substrate so as to form a third pn junction with said germanium substrate, and the third pn junction is used as a substrate side cell.

26. The solar cell of claim 25, further comprising a second tunnel junction layer disposed between said bottom and substrate side cells.

* * * * *